(12) United States Patent
Buot et al.

(10) Patent No.: US 12,021,063 B2
(45) Date of Patent: Jun. 25, 2024

(54) CIRCULAR BOND FINGER PAD

(71) Applicant: QUALCOMM Incorporated, San Diego, CA (US)

(72) Inventors: Joan Rey Villarba Buot, Escondido, CA (US); Aniket Patil, San Diego, CA (US); Zhijie Wang, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 304 days.

(21) Appl. No.: 17/161,105

(22) Filed: Jan. 28, 2021

(65) Prior Publication Data
US 2022/0238488 A1 Jul. 28, 2022

(51) Int. Cl.
| | |
|---|---|
| *H01L 25/065* | (2023.01) |
| *H01L 23/00* | (2006.01) |
| *H01L 23/31* | (2006.01) |
| *H01L 23/498* | (2006.01) |
| *H01L 25/00* | (2006.01) |

(52) U.S. Cl.
CPC ...... *H01L 25/0657* (2013.01); *H01L 23/3128* (2013.01); *H01L 23/49811* (2013.01); *H01L 23/49822* (2013.01); *H01L 23/49827* (2013.01); *H01L 23/49866* (2013.01); *H01L 24/16* (2013.01); *H01L 24/48* (2013.01); *H01L 24/85* (2013.01); *H01L 25/50* (2013.01); *H01L 2224/16225* (2013.01);
(Continued)

(58) Field of Classification Search
CPC ........... H01L 23/3128; H01L 23/49811; H01L 23/49822; H01L 23/49866; H01L 24/16; H01L 24/48; H01L 24/85; H01L 25/50; H01L 25/0657; H10B 80/00
USPC ........................................................ 257/668
See application file for complete search history.

(56) References Cited

U.S. PATENT DOCUMENTS

2005/0147801 A1\* 7/2005 Taggert ............ H01L 23/49866
428/209
2009/0242245 A1 10/2009 Asano
(Continued)

FOREIGN PATENT DOCUMENTS

EP 1187210 A2 3/2002

OTHER PUBLICATIONS

International Search Report and Written Opinion—PCT/US2021/065329—ISA/EPO—Apr. 14, 2022.

*Primary Examiner* — Jasmine J Clark
(74) *Attorney, Agent, or Firm* — Muncy, Geissler, Olds & Lowe, P.C.

(57) ABSTRACT

Disclosed are examples of integrated circuit (IC) packages. Each IC package may include a flip-chip (FC) die on a substrate, a wire bond die above the FC die, a wire bond connected to the wire bond die, and a mold on the substrate and encapsulating the FC die, the wire bond die, and the wire bond. The substrate may include least a first metallization layer includes a first substrate layer, a trace on the first substrate layer and routed within the first metallization layer to electrically couple with one or more FC interconnects of the FC die, and a bond finger pad formed on the trace. The bond finger pad may be circular. The wire bond may electrically connect to the trace such that the wire bond die is electrically coupled with the FC die through the wire bond, the bond finger pad, and the trace.

28 Claims, 10 Drawing Sheets

(52) U.S. Cl.
CPC ............... *H01L 2224/48227* (2013.01); *H01L 2224/48471* (2013.01); *H01L 2224/85345* (2013.01)

(56) References Cited

U.S. PATENT DOCUMENTS

| | | |
|---|---|---|
| 2010/0007019 A1 | 1/2010 | Pendse |
| 2015/0035172 A1 | 2/2015 | Imazeki et al. |
| 2018/0005944 A1 | 1/2018 | Goh et al. |
| 2020/0395340 A1* | 12/2020 | Lee .................. H01L 23/49816 |

* cited by examiner

CIRCULAR BOND FINGER PAD

FIELD OF DISCLOSURE

This disclosure relates generally to integrated circuits (IC) packages, and more specifically, but not exclusively, to circular bond finger pad, e.g., for 5G devices.

BACKGROUND

Integrated circuit technology has achieved great strides in advancing computing power through miniaturization of active components. The package devices can be found in many electronic devices, including processors, servers, radio frequency (RF) integrated circuits, etc. Packaging technology becomes cost-effective in high pin count devices and/or high production volume components.

An example conventional IC package includes a flip-chip (FC) die, such as a baseband modem, on a substrate. A memory die is above the baseband modem with a die attach adhesive therebetween. A mold encapsulates the baseband modem and the memory die on and above the substrate. The substrate includes a metallization layer in which traces are routed to electrically couple with solder bumps of the baseband modem. Within the mold, wire bonds (e.g., formed of gold (Au), silver (Ag), copper (Cu), etc.) are used to electrically couple the memory die with the baseband modem through the trace. The wire bonds connect to the traces through bond finger pads on the traces. Typically, pads are nickel/gold (Ni/Au) plated surfaces. This means that the traces are formed from electrolytic plating processes. That is, the traces are plating traces. As such, the plating traces are extended to the edge of the substrate. The traces at the edge are connected to plating lines that electrically connect to all of the bond finger pads to be used for electrolytic upper plating of the bond finger pads.

The shape of the bond finger pads (e.g., formed from Cu) is typically oblong or oval. This is because the pads are non-solder mask defined (NSMD), in which the pad is metal defined and the solder mask opening is wider than the pad. This means that the whole of the Cu pad is exposed since there is a clearance between the solder mask opening and the pad.

The solder mask opening can shift in any direction. This means that NSMD bond finger pad typically requires loose spacing design rules due to Ni/Au plating. Unfortunately, this results in low Cu density in the bond finger area. Also, the bond fingers are located near edge of the substrate in conventional packaging for easier plating trace routing. This means that long wire bonds are needed to connect the memory die to the bond fingers. This increases electrical resistances of the wire bonds. Long wire bonds are also more difficult to achieve.

Accordingly, there is a need for systems, apparatus, and methods that overcome the deficiencies of conventional packages including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary integrated circuit (IC) package is disclosed. The IC package may comprise a substrate, a flip-chip (FC) die, a wire bond die disposed above the FC die, a wire bond connected to the wire bond die, and a mold on the substrate. The mold may encapsulate the FC die, the wire bond die, and the wire bond. The substrate may comprise one or more metallization layers including a first metallization layer. The first metallization layer may comprise, a first substrate layer, a trace, and a bond finger pad. The trace may be formed on the first substrate layer and routed within the first metallization layer to electrically couple with one or more FC interconnects of the FC die. The bond finger pad may be formed on the trace. A shape of the bond finger pad may be substantially circular. The wire bond may electrically connect to the bond finger pad such that the wire bond die is electrically coupled with the FC die through the wire bond, the bond finger pad, and the trace.

A method of fabricating an integrated circuit (IC) package is disclosed. The method may comprise forming a substrate. The method may also comprise disposing a flip-chip (FC) die on the substrate. The method may further comprise disposing a wire bond die above the FC die. The method may yet comprise forming a wire bond connected to the wire bond die. The method may yet further comprise forming a mold on the substrate, the mold encapsulating the FC die, the wire bond die, and the wire bond. The substrate may be formed to comprise one or more metallization layers including a first metallization layer. The first metallization layer may comprise, a first substrate layer, a trace, and a bond finger pad. The trace may be formed on the first substrate layer and routed within the first metallization layer to electrically couple with one or more FC interconnects of the FC die. The bond finger pad may be formed on the trace. A shape of the bond finger pad may be substantially circular. The wire bond may be formed to electrically connect to the bond finger pad such that the wire bond die is electrically coupled with the FC die through the wire bond, the bond finger pad, and the trace.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
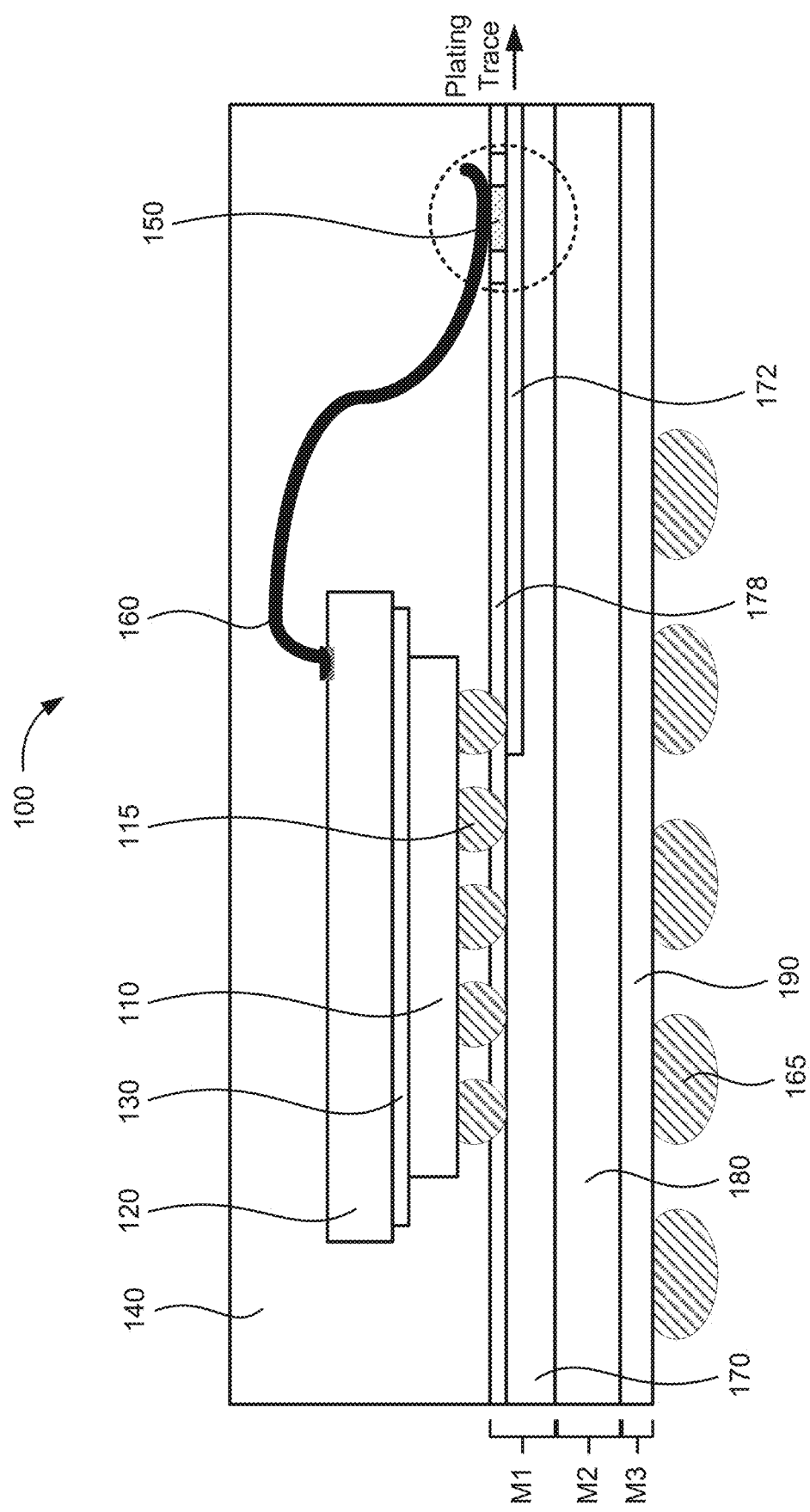
FIG. 1 illustrates an example of a conventional integrated circuit (IC) package.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In accordance with various aspects herein, it is proposed to address issues associated with conventional IC packages. For context, an example of a conventional IC package is illustrated in FIG. 1. The conventional IC package 100 includes a baseband modem 110, which is a flip-chip (FC) die, on a three-layer substrate. A memory die 120 is above the baseband modem 110 with a die attach adhesive 130 therebetween. A mold 140 encapsulates the baseband modem 110 and the memory die 120 on and above the substrate.

The three-layer substrate includes metallization layers M1, M2 and M3. The M1 layer includes a first substrate layer 170, the M2 layer includes a second substrate layer 180, and the M3 layer includes a third substrate layer 190. Within metallization layer M1, a trace 172 is routed to electrically couple with solder bumps 115 of the baseband modem 110. Also within the metallization layer M1, a solder resist (SR) 178 is formed on the trace 172 as well as on the first substrate 170. A bond finger pad 150 (more on this below) is formed on the trace 172 within an opening of the solder resist 178. Solder balls 165 are formed on a lower surface of the third substrate layer 190.

Within the mold 140, a wire bond 160 (e.g., formed of gold (Au), silver (Ag), copper (Cu), etc.) is used to electrically couple the memory die 120 with the baseband modem 110 through the trace 172. The wire bond 160 electrically connects to the trace 172 through the bond finger pad 150.

Typically, the bond finger pad 150 is nickel/gold (Ni/Au) plated on a surface of the trace 172. As such, the trace 172 can also be referred to as a plating trace. The plating trace 172 is extended to the edge of the substrate. The plating trace 172 at the edge is connected to one or more plating lines (not shown) that electrically connect to the bond finger pad 150 to be used for electrolytic upper plating of the bond finger pad 150.

In FIG. 1, a vicinity of the bond finger pad 150 is highlighted with a dashed circle. Note that the bond finger pad 150 is formed within an opening of the solder resist 178. Also note that on either side of the bond finger pad 150, there is a gap between the bond finger pad 150 and the solder resist 178. That is, the opening of the solder resist 178—also referred to as solder resist opening (SRO)—is wider than the bond finger pad 150.

Figure 2:
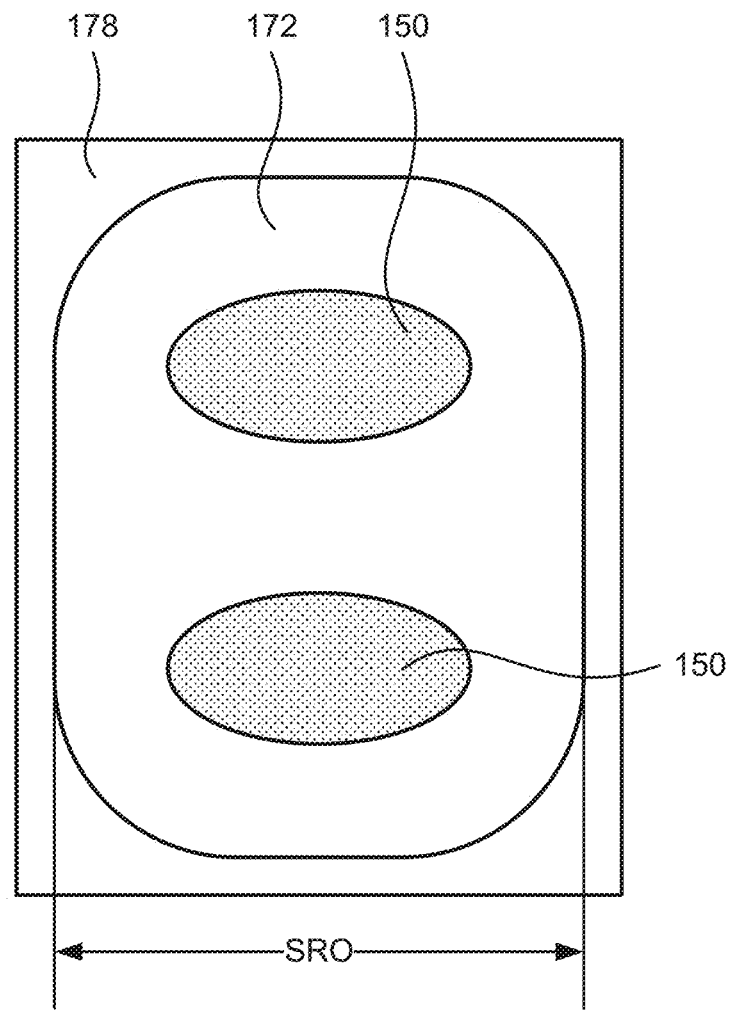
FIG. 2 illustrates a bond finger pad of the conventional IC package.

A top-down view of the M1 layer of the bond finger pad vicinity is illustrated in FIG. 2. Here, two bond finger pads 150 are illustrated as being formed within the SRO, which is an area of the trace 172 not covered by the solder resist 178. As seen, shape of the bond finger pads 150 (e.g., formed from Ni/Au plating) is typically oblong or oval. For example, the dimension of each bond finger pad 150 can be 100 μm (e.g., side to side in FIG. 2) by 50 μm (e.g., up-down in FIG. 2).

The bond finger pads 150 are examples of non-solder mask defined (NSMD) pads. As indicated, the SRO is wider than the bond finger pads 150. This means that the shape of the bond finger pad 150 is not defined by the solder resist 178 (also referred to as solder mask). Rather, the bond finger pad 150 is metal defined.

Since the SRO is wider than the bond finger pads 150, the whole of the bond finger pad 150 is exposed due to the clearance between the SRO and the bond finger pad 150. The SRO can shift in any direction. This means that bond finger pad 150 requires loose spacing design rules due to Ni/Au plating. This is because any metal exposed in the SRO including any traces 172 may also be subject to plating when the bond finger pad 150 is formed. This means traces 172 can become thick. As a result, neighboring traces 172 may be shorted. Loose spacing design means that the sufficient spacing between adjacent bond finger pads 150 is provided to prevent issues such as undesirable shorts from occurring. The spacings between adjacent bond finger pads 150 can be significant, e.g., 25 μm or more. Unfortunately, loose spacing results in low Cu density in the SRO area. In printed circuit boards (PCB), low Cu density areas can be subject to undesirable issues such as warpage (e.g., 2 mm or more). This can be true in particular for prepreg PCBs.

Another issue is the following. Referring back to FIG. 1, the NSMD bond finger pads 150 are located near the edge of the substrate for easier plating trace routing to the edge of the substrate. This means that the wire bond 160 needs to be very long. Unfortunately, long wire bonds are associated with electrical (e.g., high resistance) and process concerns (e.g., wire shorts).

In accordance with the various aspects disclosed herein, to address issues associated with conventional IC packages, it is proposed to provide a circular bond finger pad that is solder mask defined (SMD). In SMD pads, the solder mask is smaller than the actual metal making up the bond finger pad. This implies that when electrolytic plating process is performed, only the opening—the solder mask opening (SMO)—is plated to form the bond finger pad. The traces are not subjected to plating. As a result, spacing between adjacent bond finger pads can be reduced—e.g., to 15 µm or even less—without the worry of shorts occurring. This means that metal density (e.g., Cu density) can be high, which leads to the warpage being reduced or even being eliminated.

Another advantage of proposed SMD bond finger pad can be located anywhere. Recall that the location of the conventional NSMD bond finger pad 150 is limited to be near the edge of the substrate. However, the proposed SMD bond finger pad can be located anywhere on the substrate. For example, the proposed SMD bond finger pad can be located close to the memory die. As a result, the wire bond can be short, which can reduce electrical resistance, and also reduce the likelihood of wire shorts.

Figure 3:
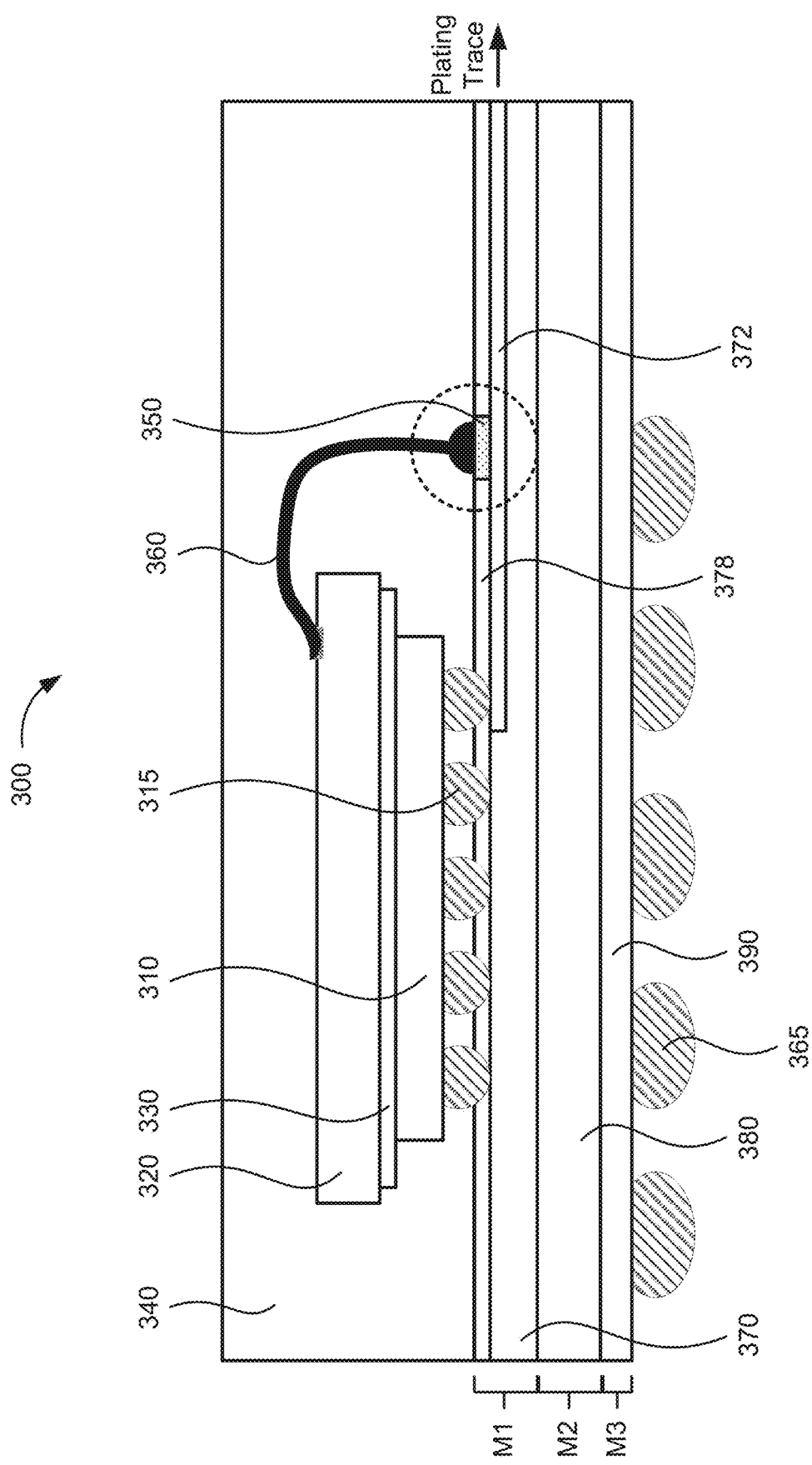
FIG. 3 illustrates an example of an IC package in accordance with one or more aspects of the disclosure.

An example of an IC package in accordance with at one or more aspects of the disclosure is illustrated in FIG. 3. The example IC package 300 may include a flip-chip (FC) die 310. A baseband modem die may be an example of the FC die 310. The FC die 310 may be on a substrate that includes one or more metallization layers (described further below). A wire bond die 320 (e.g., a memory die) may be disposed above the FC die 310 with a die attach adhesive 330 therebetween. A mold 340 may encapsulate the FC die 310 and the wire bond die 320 on and above the substrate.

In FIG. 3, a substrate with three metallization layers M1, M2 and M3 is shown. This is merely an example. The actual number of metallization layers is not so limited. That is, the substrate may include one or more metallization layers. Each metallization layer may include a substrate layer. For example, the M1 metallization layer (or first metallization layer) may include a first substrate layer 370. Likewise, the M2 metallization layer (or second metallization layer) may include a second substrate layer 380, the M3 metallization layer (or third metallization layer) may include a third substrate layer 390, and so on. The substrate layers 370, 380, 390 may each be insulating layers.

Within one, some all of the metallization layers, traces may be routed to electrically couple with FC interconnects 315 (e.g., bumps) of the FC die 310. For example, in FIG. 3, within the first metallization layer M1, a trace 372 may be formed on the first substrate layer 370 and routed to electrically couple with the FC interconnects 315. The trace 372 may be formed from conductive metals such as Cu, aluminum (Al), etc.

Also within the first metallization layer M1, a solder mask (SM) 378 (e.g., solder resist) may be formed on the trace 372 as well as on the first substrate layer 370. A bond finger pad 350 may be formed on the trace 372 within a solder mask opening (SMO, more on this below) of the solder mask 378. External interconnects 365 (e.g., solder balls) may be formed on a lower surface of the substrate. In this instance, the external interconnects 365 may be formed on a lower surface of the lowest substrate layer, which in this instance, is the substrate layer 390.

Within the mold 340, a wire bond 360 may be formed to electrically couple the wire bond die 320 with the FC die 310. For example, ends of the wire bond 360 may be connected to the wire bond die 320 and to the bond finger pad 350. In this way, the wire bond die 320 may be electrically coupled with the FC die 310 through the wire bond 360, the bond finger pad 350, and the trace 372. The wire bond 360 may be formed from metals such as gold (Au), silver (Ag), copper (Cu), etc.

While not shown, it should be noted that in actuality, there will likely be multiple wire bonds 360, multiple bond finger pads 350, and multiple traces 372. However, for ease of description and explanation, only one wire bond 360 and corresponding one bond finger pad 350 are illustrated.

The bond finger pad 350 may be a metal (e.g., nickel/gold (Ni/Au)) plated on a surface of the trace 372. The trace 372 may be extended from the bond finger pad 350 to the edge of the substrate within the first metallization layer M1 such that the trace 372 at the substrate edge is electrically coupled with the bond finger pad 350. In this way, the trace 372 may be connected to one or more plating lines (not shown) at the substrate edge for electrolytic plating of the bond finger pad 350.

In FIG. 3, the vicinity of the bond finger pad 350 is highlighted with a dashed circle. The bond finger pad 350 may formed within the opening of the solder mask 378, i.e., within the solder mask opening (SMO). But unlike the bond finger pad 150 of the conventional IC package 100, there is no gap between the bond finger pad 350 and the solder mask 378. That is, the SMO is not wider than the bond finger pad 350.

Figure 4:
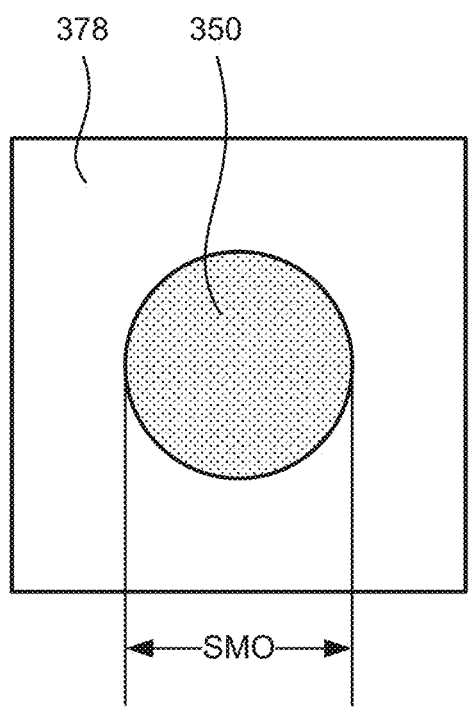
FIG. 4 illustrates a bond finger pad of an IC package in accordance with one or more aspects of the disclosure.

A top-down view of the M1 layer of the bond finger pad vicinity is illustrated in FIG. 4. Here, a single bond finger pad 350 is illustrated as being formed within the SMO. The SMO may be defined as an area above first substrate layer 370 and the trace 372 not covered by the solder mask 378. Note that the first substrate layer 370 and the trace 372 are not visible in this top-down view. This is because the first substrate layer 370 and the trace 372 are completely covered by the solder mask 378 and the bond finger pad 350, at least within the vicinity of the bond finger pad 350.

Unlike the conventional bond finger pad 150, the shape of the bond finger pad 350 (e.g., formed metal (e.g., Ni/Au) plating) can be circular or substantially circular. Also, the dimension or size of the bond finger pad 350 can be made small. For example, the bond finger pad 350 may be 50 µm or less in diameter, which means that the SMO may also be 50 µm or less. The bond finger pad 350 is an example of a solder mask defined (MSD) pad. In other words, characteristics of the bond finger pad 350 (e.g., size, shape, etc.) can be defined, at least in part, by the solder mask 378.

Recall from above that with the conventional IC package 100, loose spacing design is necessary. But with SMD bond finger pads 350, the spacings may be tightened. This is because the trace 372 is covered by the solder mask 378, i.e., trace 372 is not exposed. More specifically, other than a portion of the trace 372 on which the bond finger pad 350 is formed, i.e., other than the portion of the trace 372 corresponding to the SMO, the trace 372 is NOT exposed.

Thus, even when the trace 372 is used in the electrolytic plating process to form the bond finger pad 350, the trace 372 itself is not subject to plating. Thus, the size of the trace 372 is not altered, at least not significantly, during plating. This means that the likelihood of shorts developing among traces 372 can be reduced significantly. As a result, the spacings between bond finger pads 350 may be reduced, e.g., to 15 µm or less.

Since the spacings among the among the traces 372 can be reduced, this implies that the density of the traces 372 can correspondingly increase. In other words, metal density (e.g., Cu density) can increase with SMD bond finger pads 350. This is advantageous in that the warpage can be reduced (e.g., less than 2 mm) or even eliminated.

Referring back to FIG. 3, note that the bond finger pad 350 is located close to the wire bond die 320. Indeed, it may be said that the bond finger pad 350 may be located such that a die-pad distance, which may be defined as a distance from the wire bond die 320 to the bond finger pad 350, is less than an edge-pad distance, which may be defined as a distance from the edge of the substrate to the bond finger pad 350. This is opposite of the conventional IC package in which die-pad distance is much greater than the edge-pad distance. Because of the short die-pad distance, the wire bond 360 can be made correspondingly short. As a result, electrical characteristics may be improved (e.g., lower resistance) and process concerns may be reduced (e.g., less likelihood of wire shorts).

Also, the wire bond 360 may be a reverse wire bond. That is, one end of the wire bond 360 may be ball bonded to the bond finger pad 350 and other end may be stitch bonded to the wire bond die 320. While not shown, there may be multiple wire bond dies 320 above FC die 310, and all wire bond dies 320 and the FC die 310 may be encapsulated by the mold 340. Also, each of the multiple wire bond dies 320 may be electrically coupled to the FC die 310 through corresponding wire bonds 360 and bond finger pads 350.

Figure 5:
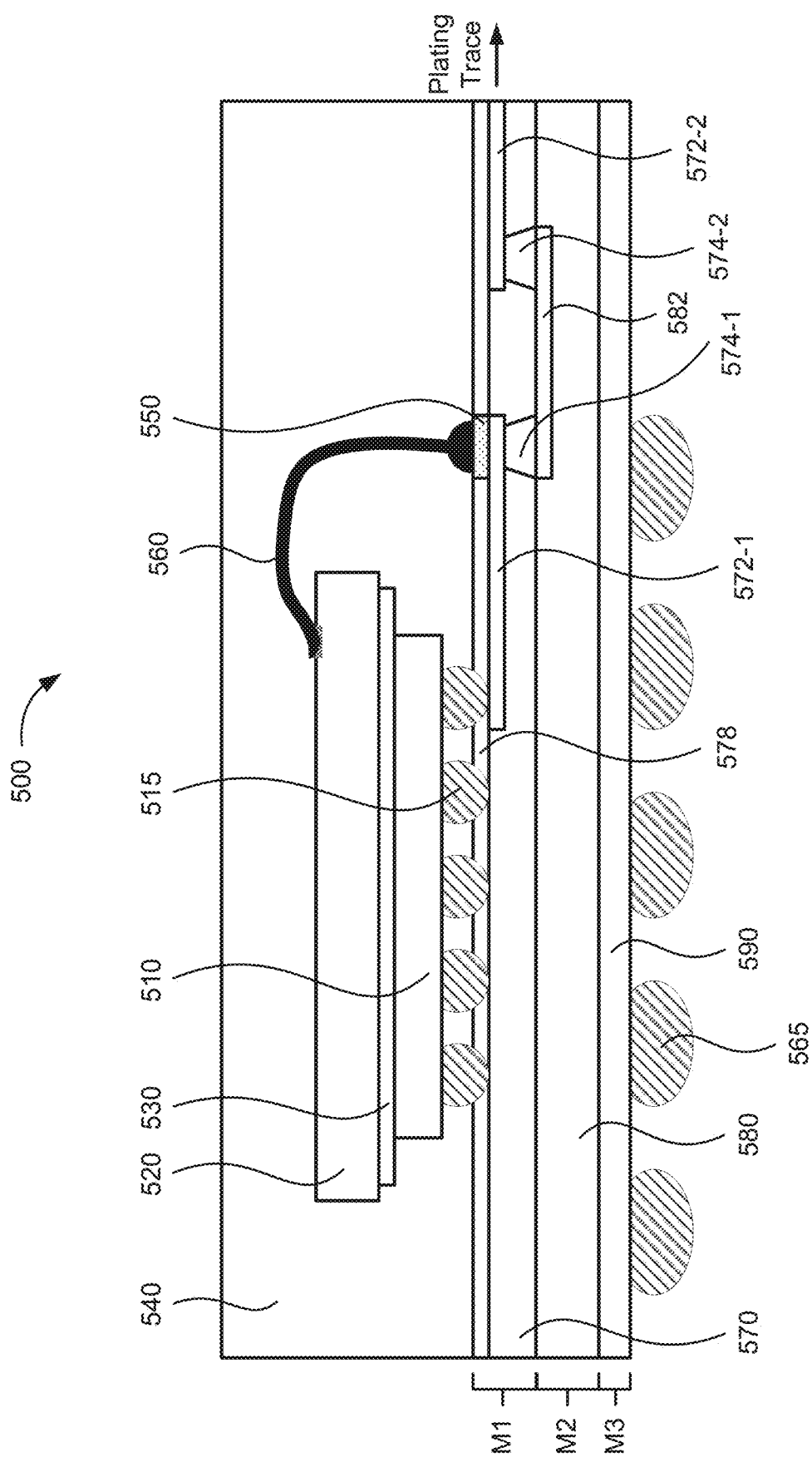
FIGS. 5-6 illustrate more examples of IC packages in accordance with one or more aspects of the disclosure.

FIG. 5 illustrates another example of an IC package 500 in accordance with one or more aspects of the disclosure. The IC package 500 may include a flip-chip (FC) die 510 (e.g., a baseband modem) on a substrate, wire bond die 520 (e.g., a memory die) disposed above the FC die 510 with a die attach adhesive 530 therebetween, a mold 540 encapsulating the FC die 510 and the wire bond die 520 on and above the substrate. The substrate may include one or more metallization layers (e.g., M1, M2, M3, etc.) and each metallization layer may include a corresponding substrate layer (e.g., first substrate layer 570, second substrate layer 580, third substrate layer 590, etc.).

Within one, some all of the metallization layers, traces may be routed to electrically couple with FC interconnects 515 (e.g., bumps) of the FC die 510. For example, in FIG. 5, within the first metallization layer M1, a trace 572-1 may be formed on the first substrate layer 570 and routed to electrically couple with the FC interconnects 515. For reasons discussed below, the trace 572-1 may also be referred to as a first layer-1 trace 572-1.

Also within the first metallization layer M1, a solder mask (SM) 578 (e.g., solder resist) may be formed on the first layer-1 trace 572-1 as well as on the first substrate layer 570. A bond finger pad 550 may be formed on the first layer-1 trace 572-1 within the SMO. External interconnects 565 (e.g., solder balls) may be formed on a lower surface of the substrate (e.g., on a lower surface of the third substrate layer 590, which is the lowest substrate layer of the substrate.

Within the mold 540, a wire bond 560 may be formed to electrically couple the wire bond die 520 with the FC die 510. For example, ends of the wire bond 560 may be connected to the wire bond die 520 and to the bond finger pad 550. In this way, the wire bond die 520 may be electrically coupled with the FC die 510 through the wire bond 560, the bond finger pad 550, and the trace first layer-1 trace 572-1. The wire bond 560 may be formed from metals such as gold (Au), silver (Ag), copper (Cu), etc.

The IC package 500 of FIG. 5 is similar to the IC package 300 of FIG. 3. One main difference between the IC packages 500 and 300 is in routing of the traces. Recall that in FIG. 3, the trace 372 may be extended from the bond finger pad 350 to the edge of the substrate entirely within the first metallization layer M1. The plating line (not shown) may electrically couple with the trace 372 at the first metallization layer M1 for electrolytic plating.

In FIG. 5, the electric coupling of the plating line to plate the bond finger pad 550 also occurs at the first metallization layer M1. However, simply extending a trace from the bond finger pad 550 to the edge of the substrate within the first metallization layer M1 may be difficult, or even impossible. For example, it may be that there are multiple traces that need to be routed within the first metallization layer M1, and extending a trace from the bond finger pad 550 to the edge may make it difficult to route other traces within the first metallization layer M1.

However, if the trace routing for plating can be accomplished through other metallization layers, then the routing of traces as a whole may be more optimized. As seen in FIG. 5, in addition to the first layer-1 trace 572-1, the first metallization layer M1 may also include a second layer-1 trace 572-2, a first layer-1 via 574-1, and a second layer-1 via 574-2. The second layer-1 trace 572-2 may be formed on the first substrate layer 570. The first and second layer-1 vias 574-1, 574-2 may be formed through the first substrate layer 570, respectively from the first and second layer-1 traces 572-1, 572-2 to a lower surface of the first metallization layer M1. Each of the first and second layer-1 traces 572-1, 572-2 as well as the first and second layer-1 vias 574-1, 574-2 may be formed from conductive metals such as Cu, Al, etc.

The second metallization layer M2 may include a layer-2 trace 582 formed on the second substrate layer 580. The layer-2 trace 582 may also be formed from conductive metal such as Cu, Al, etc. As seen, the routing for plating from the bond finger pad 550 to the edge of the substrate may be through, in order, the first layer-1 trace 572-1, the first layer-1 via 574-1, the layer-2 trace 582, the second layer-1 via 574-2, and the second layer-1 trace 572-2.

The second layer-1 trace 572-2 may be extended from an interior to the edge of the substrate within the first metallization layer M1 such that the second layer-1 trace 572-2 at the substrate edge is electrically coupled with the bond finger pad 550. In this way, the second layer-1 trace 572-2 may be connected to one or more plating lines (not shown) at the substrate edge for electrolytic plating of the bond finger pad 550.

When there are multiple metallization layers, it is not necessary for the plating line to always couple with a trace (e.g., trace 372, second layer-1 trace 572-2, etc.) at the first metallization layer M1. For example, with regards to FIG. 5, extending the layer-2 trace 582 to the edge of the substrate (not shown) may be an option. Then the layer-2 trace 582 may be connected to one or more plating lines for electrolytic plating of the bond finger pad 550.

Figure 6:
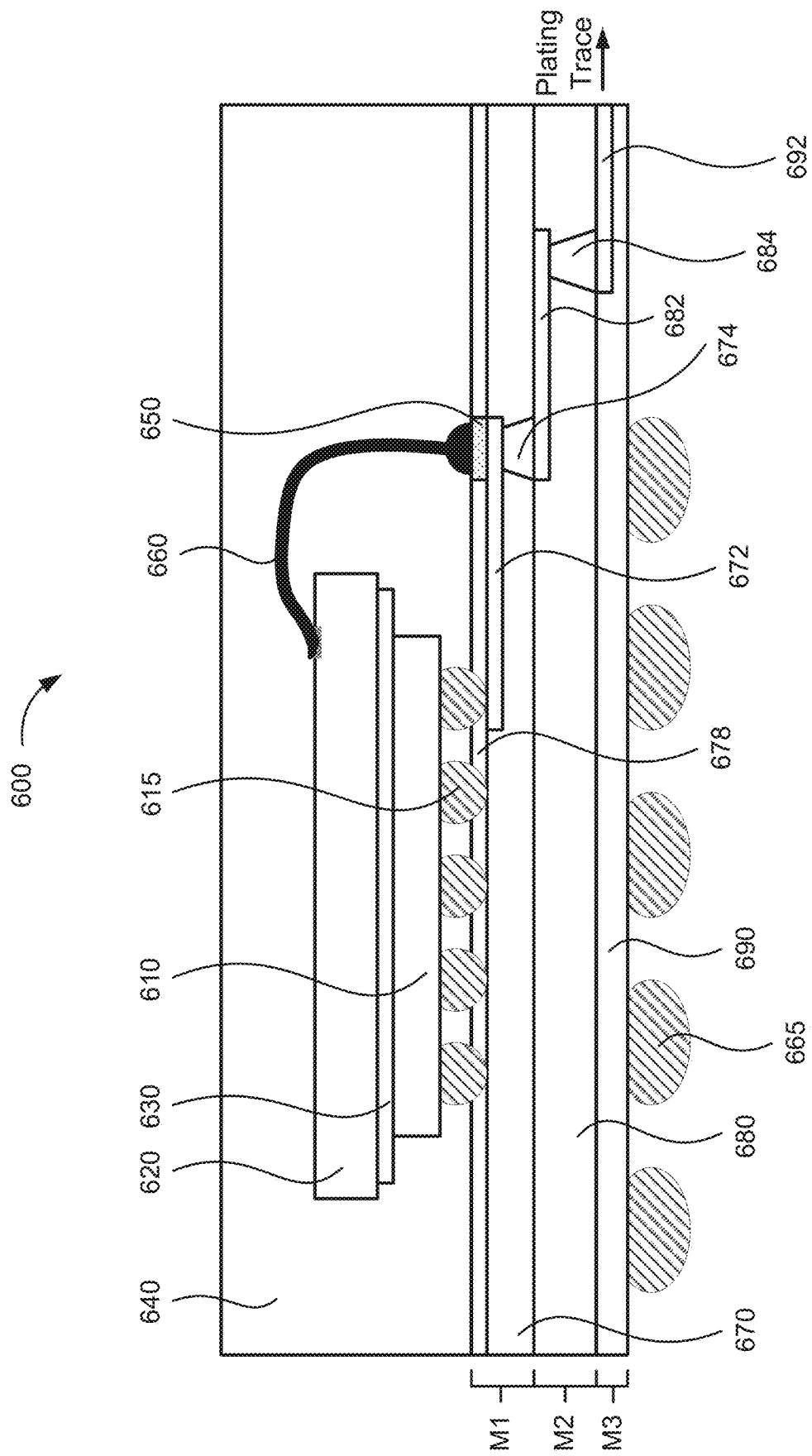

Another alternative is shown in FIG. 6, which illustrates an example IC package 600 in accordance with one or more aspects of the disclosure. The IC package 600 may include a flip-chip (FC) die 610 (e.g., a baseband modem) on a substrate, wire bond die 620 (e.g., a memory die) disposed above the FC die 610 with a die attach adhesive 630 therebetween, a mold 640 encapsulating the FC die 610 and the wire bond die 620 on and above the substrate. The substrate may include one or more metallization layers (e.g., M1, M2, M3, etc.) and each metallization layer may include a corresponding substrate layer (e.g., first substrate layer 670, second substrate layer 680, third substrate layer 690, etc.).

Within one, some all of the metallization layers, traces may be routed to electrically couple with FC interconnects 615 (e.g., bumps) of the FC die 610. For example, in FIG. 6, within the first metallization layer M1, a layer-1 trace 672 may be formed on the first substrate layer 670 and be routed to electrically couple with the FC interconnects 615.

Also within the first metallization layer M1, a solder mask (SM) 678 (e.g., solder resist) may be formed on the layer-1 trace 672 as well as on the first substrate layer 670. A bond finger pad 650 may be formed on the layer-1 trace 672-1 within the SMO. External interconnects 665 (e.g., solder balls) may be formed on a lower surface of the substrate (e.g., on a lower surface of the third substrate layer 690, which is the lowest substrate layer of the substrate.

Within the mold 640, a wire bond 660 may be formed to electrically couple the wire bond die 620 with the FC die 610. For example, ends of the wire bond 660 may be connected to the wire bond die 620 and to the bond finger pad 650. In this way, the wire bond die 620 may be electrically coupled with the FC die 610 through the wire bond 660, the bond finger pad 650, and the layer-1 trace 672. The wire bond 360 may be formed from metals such as gold (Au), silver (Ag), copper (Cu), etc.

The IC package 600 of FIG. 6 is similar to the IC packages 300 and 500 of FIGS. 3 and 5. One main difference is that plating line (not shown) may electrically couple with a trace at a metallization layer other than the first metallization layer M1 for electrolytic plating of the bond finger pad 650.

In FIG. 6, the first metallization layer M1 may also include a layer-1 via 674 in addition to the layer-1 trace 672. The layer-1 via 674 may be formed through the first substrate layer 370. The second metallization layer M2 may include a layer-2 trace 682 and a layer-2 via 684. The layer-2 trace 682 may be formed on the second substrate layer 680, and the layer-2 via 684 may be formed through the second substrate layer 680. The third metallization layer M3 may include a layer-3 trace formed on the third substrate layer 690. Each of the layer-1 trace 672, the layer-1 via 674, the layer-2 trace 682, the layer-2 via 684, and the layer-3 trace 692 may be formed from conductive metals such as Cu, Al, etc.

As seen, the routing for plating from the bond finger pad 650 to the edge of the substrate may be through, in order, the layer-1 trace 672, the layer-1 via 674, the layer-2 trace 682, the layer-2 via 684, and the layer-3 trace 692. The layer-3 trace 692 may be extended from an interior to the edge of the substrate within the third metallization layer M3 such that the layer-3 trace 692 at the substrate edge is electrically coupled with the bond finger pad 650. In this way, the layer-3 trace 692 may be connected to one or more plating lines (not shown) at the substrate edge for electrolytic plating of the bond finger pad 650.

Figure 7:
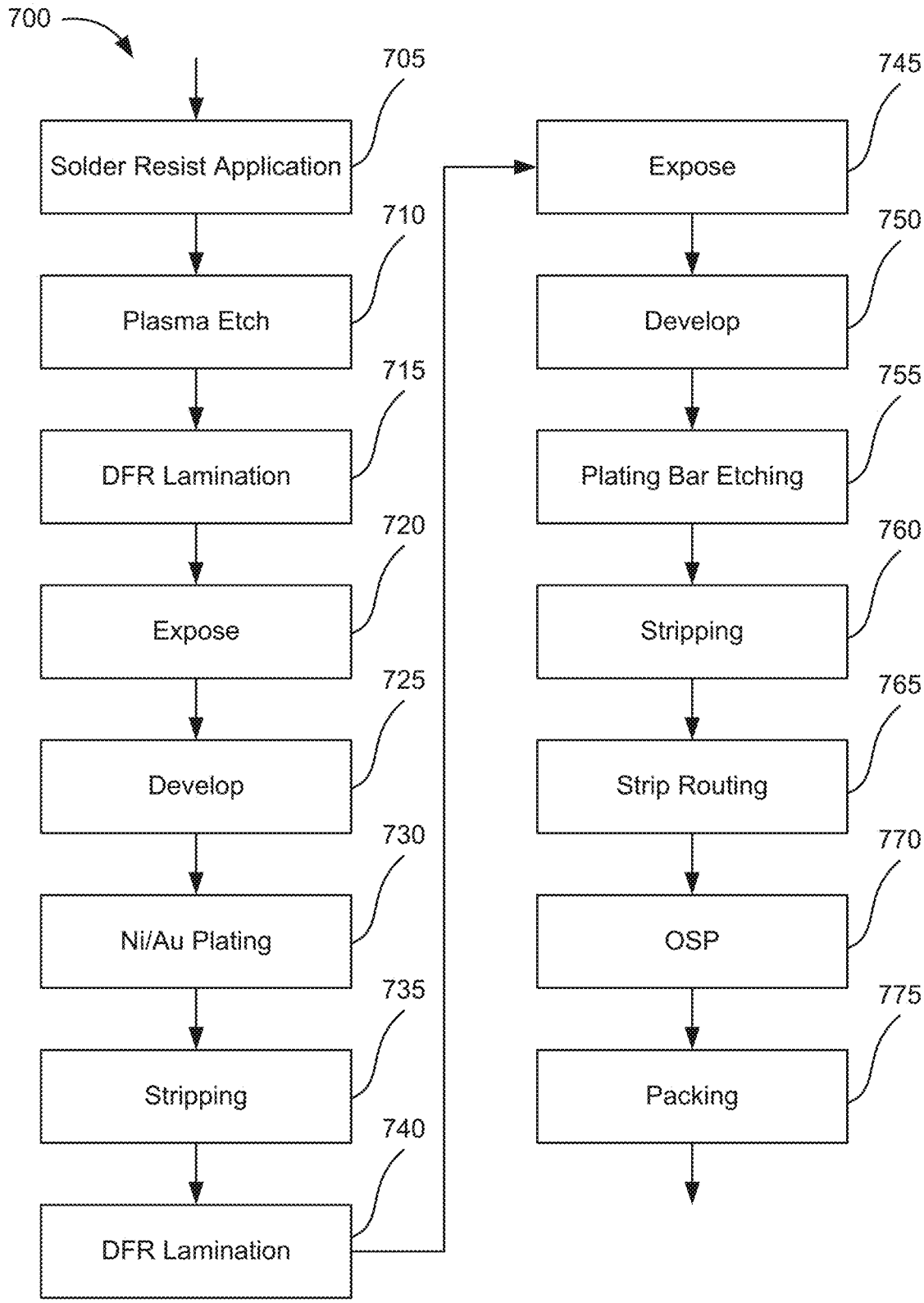
FIG. 7 a process flow of different stages of fabricating a substrate for an IC package in accordance with one or more aspects of the disclosure.

FIG. 7 illustrate a process flow 700 of different stages of fabricating a substrate for an IC package. In block 705, solder resist may be applied. In block 710, plasma etch may take place. In block 715, dry film resist (DFR) lamination may take place, followed by exposure in block 720 and development in block 725. In block 730, Ni/Au plating may be performed (e.g., to form the bond finger pad 350, 550, 650). In block 735, the substrate may be stripped.

In block 740, another DFR lamination may be performed, followed by another exposure in block 745 and another development in block 750. Then in block 755, plating bar etching may be performed, followed by stripping in block 760 and strip routing in block 765. In block 770, a preservative such as an organic solderability preservative (OSP) may be applied. In block 775, the substrate may be packed.

Figure 8:
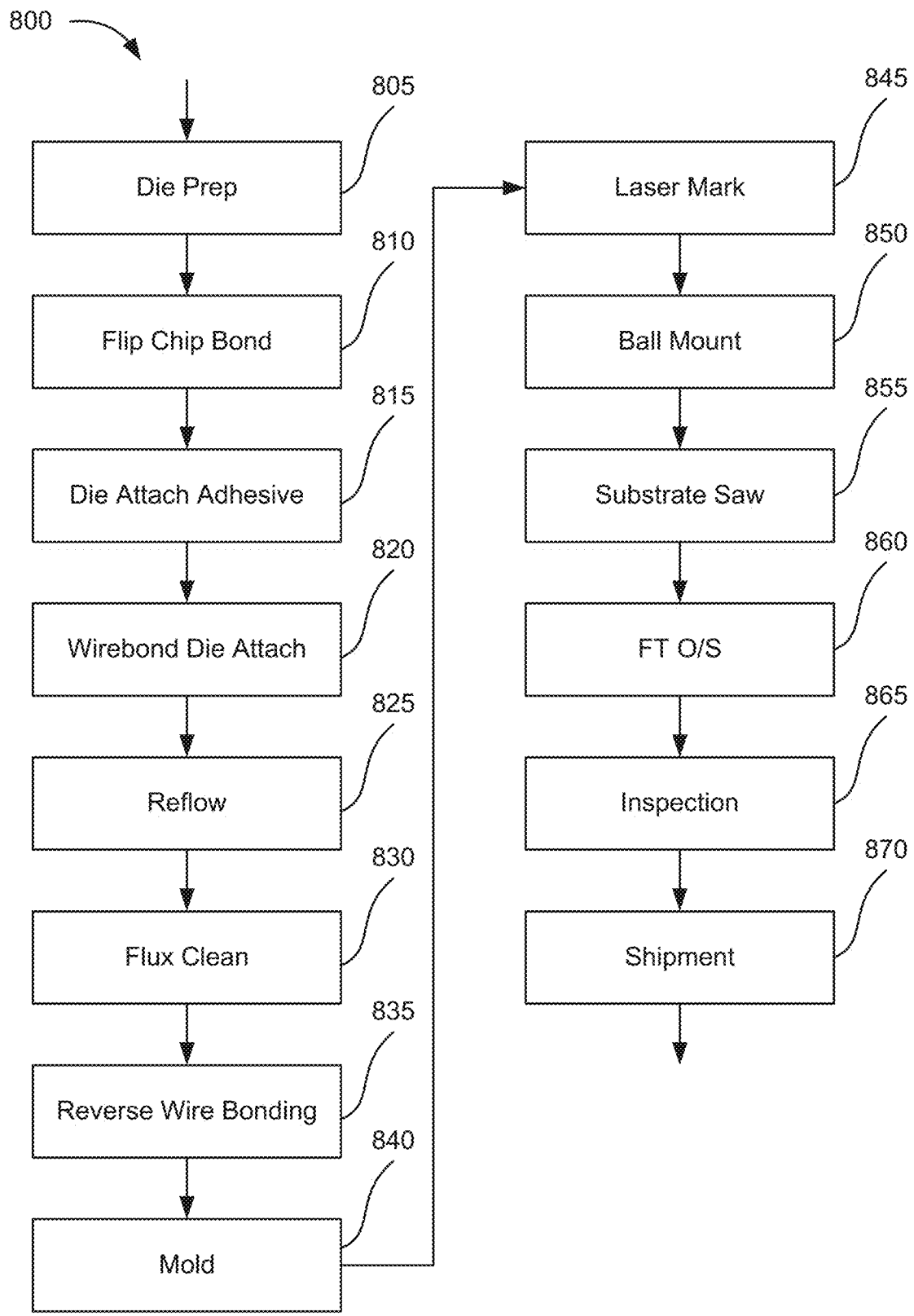
FIG. 8 a process flow of different stages of assembling an IC package in accordance with one or more aspects of the disclosure.

FIG. 8 illustrate a process flow 800 of different stages of assembling the IC package 300, 500, 600. In block 805, a die preparation may be performed. In block 810, a flip-chip (FC) die 310, 510, 610 may be bonded to a substrate. In block 815, a die attach adhesive 330, 530, 630 may be disposed on the FC die 310, 510, 610. In block 820, a wire bond die 320, 520, 620 may be attached to the FC die 310, 510, 610 through the die attach adhesive 330, 530, 630.

In block 825, a reflow may be performed, followed by a flux clean in block 830. In block 835, reverse wire-bonding may be performed to form the wire bond 360, 560, 660 which connects with the bond finger pad 350, 550, 650 and the wire bond die 320, 520, 620. In block 840, a mold 340, 540, 640 may be formed to encapsulate the FC die 310, 510, 610, the wire bond die 320, 520, 620, and the wire bond 360, 560, 660.

In block 845, laser mark may take place, followed by ball mounting in block 850, and substrate sawing in block 855. In block 860, FT 0/S may be performed. In block 865, the IC package 300, 500, 600 may be inspected and shipped in block 870.

Figure 9:
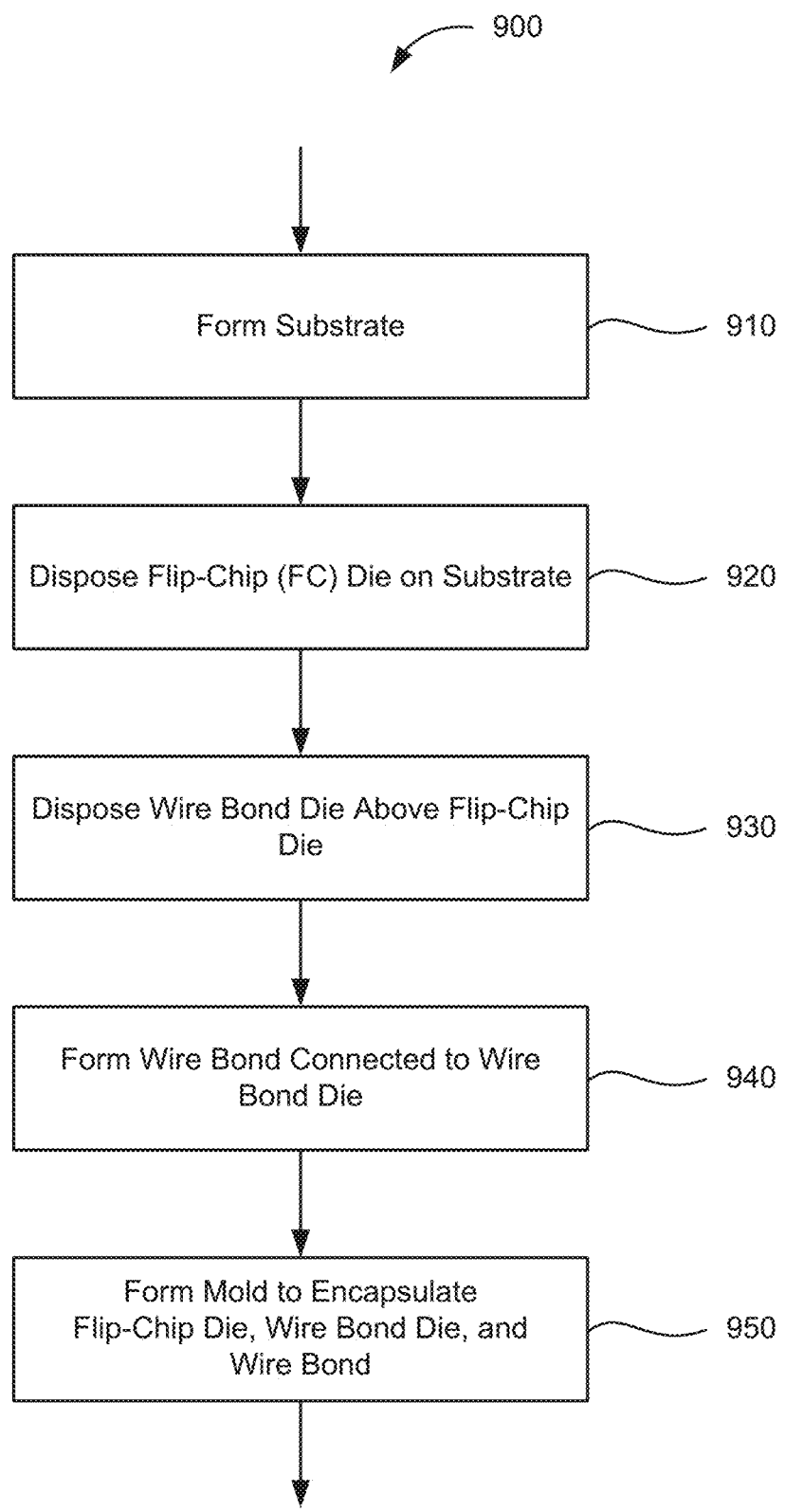
FIG. 9 illustrates a flow chart of an example method of manufacturing an IC package in accordance with at one or more aspects of the disclosure.

FIG. 9 illustrates a flow chart of an example method 900 of fabricating an IC package such as any of the IC packages 300, 500, 600. In block 910, a substrate may be formed.

In block 920, flip-chip (FC) die (e.g., FC die 310, 510, 610) may be disposed on the substrate.

In block 930, a wire bond die (e.g., wire bond die 320, 520, 620) may be disposed above the FC die. For example, a die attach adhesive (e.g., die attach adhesive 330, 530, 630) may be used.

In block 940, a wire bond (e.g., wire bond 360, 560, 660) may be formed to connect to the wire bond die.

In block 950, a mold may be formed on the substrate to encapsulate the FC die, the wire bond die, and the wire bond.

In an aspect, the substrate may be formed in block 910 to comprise one or more metallization layers including a first metallization layer (M1) (e.g., metallization layer M1). The first metallization layer may comprise a first substrate layer (e.g., first substrate layer 370, 570, 670); a trace (e.g., trace 372, first layer-1 trace 572-1, layer-1 trace 672) formed on the first substrate layer and routed within the first metallization layer to electrically couple with one or more FC interconnects (e.g., FC interconnects 315, 515, 615); and a bond finger pad (e.g., bond finger pad 350, 550, 650) formed on the trace. A shape of the bond finger pad may be circular or substantially circular. The wire bond may be formed to electrically connect to the bond finger pad such that the wire bond die is electrically coupled with the FC die through the wire bond, the bond finger pad, and the trace.

The first metallization layer may further comprise a solder mask (e.g., solder mask 378, 578, 678) formed on the trace and on the first substrate layer. The bond finger pad may be formed within the SMO.

In one aspect, the trace (e.g., trace 372) may be extended from the bond finger pad to an edge of the substrate within the first metallization layer (e.g., see FIG. 3).

In another aspect, the trace may be a first layer-1 trace (e.g., first layer-1 trace 572-1), and the first metallization layer may further comprises a second layer-1 trace (e.g., second layer-1 trace 572-2) formed on the first substrate layer (e.g., first substrate layer 570) and routed within the first metallization layer. The second layer-1 trace may be electrically coupled with the first layer-1 trace and extended from an interior of the substrate to an edge of the substrate within the first metallization layer (e.g., see FIG. 5).

In yet another aspect, the trace may be a layer-1 trace (e.g., layer-1 672), and the substrate further comprises an additional metallization layer (e.g., third metallization layer M3) below the first metallization layer (M1). The additional metallization layer may comprise an additional substrate layer (e.g., third substrate layer 690), and an additional trace (e.g., layer-3 trace 692) formed on the additional substrate layer and routed within the additional metallization layer. The additional trace may be electrically coupled with the layer-1 trace (672) and extended from an interior of the substrate to an edge of the substrate within the additional metallization layer (e.g., see FIG. 6).

Figure 10:
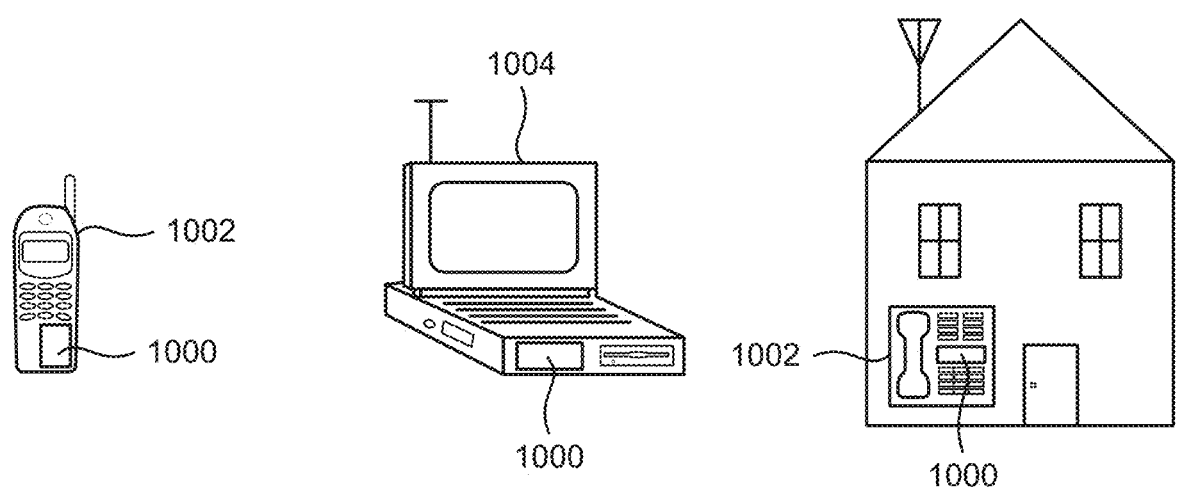
FIG. 10 illustrates various electronic devices which may utilize one or more aspects of the disclosure.

FIG. 10 illustrates various electronic devices that may be integrated with any of the aforementioned integrated circuit packages 300, 500, 600 in accordance with various aspects of the disclosure. For example, a mobile phone device 1002, a laptop computer device 1004, and a fixed location terminal device 1006 may each be considered generally as user equipment (UE) and may include an apparatus 1000 that incorporates the IC package 300, 500, 600 as described herein. The devices 1002, 1004, 1006 illustrated in FIG. 10 are merely exemplary. Other electronic devices may also include the IC package 300, 500, 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles, an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged as described herein.

The following provides an overview of examples of the present disclosure:

Example 1

An integrated circuit (IC) package, comprising: a substrate; a flip-chip (FC) die disposed on the substrate; a wire bond die disposed above the FC die; a wire bond connected to the wire bond die; and a mold on the substrate and encapsulating the FC die, the wire bond die, and the wire bond; and wherein the substrate comprises one or more metallization layers including a first metallization layer, the first metallization layer comprising: a first substrate layer; a trace formed on the first substrate layer and routed within the first metallization layer to electrically couple with one or more FC interconnects of the FC die; and a bond finger pad formed on the trace, a shape of the bond finger pad being substantially circular, and wherein the wire bond electrically connects to the bond finger pad such that the wire bond die is electrically coupled with the FC die through the wire bond, the bond finger pad, and the trace.

Example 2

The IC package of example 1, wherein the first metallization layer further comprises: a solder mask formed on the trace and on the first substrate layer, wherein the bond finger pad is formed within a solder mask opening (SMO) defining an area above the first substrate layer not covered by the solder mask.

Example 3

The IC package of example 2, wherein there is no gap between the bond finger pad and the solder mask.

Example 4

The IC package of any of examples 1-3, wherein the trace is extended from the bond finger pad to an edge of the substrate within the first metallization layer.

Example 5

The IC package of any of examples 1-3, wherein the trace is a first layer-1 trace, and wherein the first metallization layer further comprises: a second layer-1 trace formed on the first substrate layer and routed within the first metallization layer, the second layer-1 trace being electrically coupled with the first layer-1 trace and extended from an interior of the substrate to an edge of the substrate within the first metallization layer.

Example 6

The IC package of example 5, wherein the first metallization layer further comprises: a first layer-1 via formed through the first substrate layer from the first layer-1 trace to a lower surface of the first metallization layer; and a second layer-1 via formed through the first substrate layer from the second layer-1 trace to the lower surface of the first metallization layer, and wherein the substrate further comprises a second metallization layer below the first metallization layer, the second metallization layer comprising: a second substrate layer; and a layer-2 trace formed on the second substrate layer and routed within the second metallization layer to electrically couple with the first layer-1 via and with the second layer-1 via such that the bond finger pad is electrically coupled with the second layer-1 trace through, in order, the first layer-1 trace, the first layer-1 via, the layer-2 trace, and the second layer-1 via.

Example 7

The IC package of any of examples 1-3, wherein the trace is a layer-1 trace, and wherein the substrate further comprises an additional metallization layer below the first metallization layer, the additional metallization layer comprising: an additional substrate layer; and an additional trace formed on the additional substrate layer and routed within the additional metallization layer, the additional trace being electrically coupled with the layer-1 trace and extended from an interior of the substrate to an edge of the substrate within the additional metallization layer.

Example 8

The IC package of example 7, wherein the additional metallization layer is a third metallization layer, the additional substrate layer is a third substrate layer, and the additional trace is a layer-3 trace, wherein the substrate further comprises a second metallization layer in between the first metallization layer and the third metallization layer, wherein the first metallization layer further comprises: a layer-1 via formed through the first substrate layer from the layer-1 trace to a lower surface of the first metallization layer, wherein the second metallization layer comprises: a second substrate layer; a layer-2 trace formed on the second substrate layer and routed within the second metallization layer; and a layer-2 via formed through the second substrate layer from the layer-2 trace to a lower surface of the second metallization layer, and wherein the bond finger pad is electrically coupled with the layer-3 trace through, in order, the layer-1 trace, the layer-1 via, the layer-2 trace, and the layer-2 via.

Example 9

The IC package of any of examples 1-8, wherein a die-pad distance is less than an edge-pad distance, the die-pad distance being a distance from the wire bond die to the bond finger pad and the edge-pad distance being a distance from an edge of the substrate to the bond finger pad.

Example 10

The IC package of any of examples 1-9, wherein the IC package comprises multiple wire bond dies above the FC die in which each of the multiple wire bond dies are electrically coupled to the to the FC die through the corresponding wire bonds and bond finger pads.

Example 11

The IC package of any of examples 1-10, wherein the trace is formed from copper (Cu) or aluminum (Al).

Example 12

The IC package of any of examples 1-11, wherein the bond finger pad is a plated metal.

Example 13

The IC package of example 12, wherein the plated metal comprises plated nickel or gold or both.

Example 14

The IC package of any of examples 1-13, wherein the wire bond is a reverse wire bond in which one end is ball bonded to the bond finger pad and other end is stitch bonded to the wire bond die.

Example 15

The IC package of any of examples 1-14, wherein the FC die is a baseband modem die.

Example 16

The IC package of any of examples 1-15, wherein the wire bond die is a memory die.

Example 17

The IC package of any of examples 1-16, wherein the IC package is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Example 18

A method of fabricating an integrated circuit (IC) package, the method comprising: forming a substrate; disposing a flip-chip (FC) die on the substrate; disposing a wire bond die above the FC die; forming a wire bond connected to the wire bond die; and forming a mold on the substrate, the mold encapsulating the FC die, the wire bond die, and the wire bond, wherein the substrate is formed to comprise one or more metallization layers including a first metallization layer, the first metallization layer comprising: a first substrate layer; a trace formed on the first substrate layer and routed within the first metallization layer to electrically couple with one or more FC interconnects of the FC die; and a bond finger pad formed on the trace, a shape of the bond finger pad being substantially circular, and wherein the wire bond is formed to electrically connect to the bond finger pad such that the wire bond die is electrically coupled with the FC die through the wire bond, the bond finger pad, and the trace.

Example 19

The method of example 18, wherein the substrate is formed such that the first metallization layer further comprises: a solder mask formed on the trace and on the first substrate layer, wherein the bond finger pad is formed within a solder mask opening (SMO) defining an area above the first substrate layer not covered by the solder mask.

Example 20

The method of example 19, wherein there is no gap between the bond finger pad and the solder mask.

Example 21

The method of any of examples 18-20, wherein the substrate is formed such that the trace is extended from the bond finger pad to an edge of the substrate within the first metallization layer.

Example 22

The method of any of examples 18-20, wherein the trace is a first layer-1 trace, and wherein the substrate is formed such that the first metallization layer further comprises: a second layer-1 trace formed on the first substrate layer and routed within the first metallization layer, the second layer-1 trace being electrically coupled with the first layer-1 trace and extended from an interior of the substrate to an edge of the substrate within the first metallization layer.

Example 23

The method of example 22, wherein the substrate is formed such that the first metallization layer further comprises: a first layer-1 via formed through the first substrate layer from the first layer-1 trace to a lower surface of the first metallization layer; and a second layer-1 via formed through the first substrate layer from the second layer-1 trace to the lower surface of the first metallization layer, and wherein the substrate is formed to further comprise a second metallization layer below the first metallization layer, the second metallization layer comprising: a second substrate layer; and a layer-2 trace formed on the second substrate layer and routed within the second metallization layer to electrically couple with the first layer-1 via and with the second layer-1 via such that the bond finger pad is electrically coupled with the second layer-1 trace through, in order, the first layer-1 trace, the first layer-1 via, the layer-2 trace, and the second layer-1 via.

Example 24

The method of any of examples 18-20, wherein the trace is a layer-1 trace, and wherein the substrate is formed to further comprise an additional metallization layer below the first metallization layer, the additional metallization layer comprising: an additional substrate layer; and an additional trace formed on the additional substrate layer and routed within the additional metallization layer, the additional trace being electrically coupled with the layer-1 trace and extended from an interior of the substrate to an edge of the substrate within the additional metallization layer.

Example 25

The method of example 24, wherein the additional metallization layer is a third metallization layer, the additional substrate layer is a third substrate layer, and the additional trace is a layer-3 trace, wherein the substrate is formed to further comprise a second metallization layer in between the first metallization layer and the third metallization layer, wherein the substrate is formed such that the first metallization layer further comprises: a layer-1 via formed through the first substrate layer from the layer-1 trace to a lower surface of the first metallization layer, wherein the substrate is formed such the second metallization layer comprises: a second substrate layer; a layer-2 trace formed on the second substrate layer and routed within the second metallization layer; and a layer-2 via formed through the second substrate layer from the layer-2 trace to a lower surface of the second metallization layer, and wherein the bond finger pad is formed to electrically couple with the layer-3 trace through, in order, the layer-1 trace, the layer-1 via, the layer-2 trace, and the layer-2 via.

Example 26

The method of any of examples 18-25, wherein a die-pad distance is less than an edge-pad distance, the die-pad distance being a distance from the wire bond die to the bond finger pad and the edge-pad distance being a distance from an edge of the substrate to the bond finger pad.

Example 27

The method of any of examples 18-26, wherein multiple wire bond dies are formed above the FC die in which each of the multiple wire bond dies are electrically coupled to the to the FC die through the corresponding wire bonds and bond finger pads.

Example 28

The method of any of examples 18-27, wherein the wire bond is formed as a reverse wire bond in which one end is ball bonded to the bond finger pad and other end is stitch bonded to the wire bond die.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated circuit (IC) package, comprising:
a substrate;
a flip-chip (FC) die disposed on the substrate;
a wire bond die disposed above the FC die;
a wire bond connected to the wire bond die; and
a mold on the substrate and encapsulating the FC die, the wire bond die, and the wire bond; and
wherein the substrate comprises one or more metallization layers including a first metallization layer, the first metallization layer comprising:
 a first substrate layer;
 a trace formed on the first substrate layer and routed within the first metallization layer to electrically couple with one or more FC interconnects of the FC die; and
 a bond finger pad formed on the trace, a shape of the bond finger pad being substantially circular,
wherein the wire bond electrically connects to the bond finger pad such that the wire bond die is electrically coupled with the FC die through the wire bond, the bond finger pad, and the trace; and wherein the first metallization layer further comprises:
a solder mask formed on the trace and on the first substrate layer,
wherein the bond finger pad is formed within a solder mask opening (SMO) defining an area above the first substrate layer not covered by the solder mask.

2. The IC package of claim 1, wherein there is no gap between the bond finger pad and the solder mask.

3. The IC package of claim 1, wherein the trace is extended from the bond finger pad to an edge of the substrate within the first metallization layer.

4. The IC package of claim 1,
wherein the trace is a first layer-1 trace, and
wherein the first metallization layer further comprises:
 a second layer-1 trace formed on the first substrate layer and routed within the first metallization layer, the second layer-1 trace being electrically coupled with the first layer-1 trace and extended from an interior of the substrate to an edge of the substrate within the first metallization layer.

5. The IC package of claim 4,
wherein the first metallization layer further comprises:
- a first layer-1 via formed through the first substrate layer from the first layer-1 trace to a lower surface of the first metallization layer; and
- a second layer-1 via formed through the first substrate layer from the second layer-1 trace to the lower surface of the first metallization layer, and wherein the substrate further comprises a second metallization layer below the first metallization layer, the second metallization layer comprising:
- a second substrate layer; and
- a layer-2 trace formed on the second substrate layer and routed within the second metallization layer to electrically couple with the first layer-1 via and with the second layer-1 via such that the bond finger pad is electrically coupled with the second layer-1 trace through, in order, the first layer-1 trace, the first layer-1 via, the layer-2 trace, and the second layer-1 via.

6. The IC package of claim 1,
wherein the trace is a layer-1 trace, and
wherein the substrate further comprises an additional metallization layer below the first metallization layer, the additional metallization layer comprising:
- an additional substrate layer; and
- an additional trace formed on the additional substrate layer and routed within the additional metallization layer, the additional trace being electrically coupled with the layer-1 trace and extended from an interior of the substrate to an edge of the substrate within the additional metallization layer.

7. The IC package of claim 6,
wherein the additional metallization layer is a third metallization layer, the additional substrate layer is a third substrate layer, and the additional trace is a layer-3 trace,
wherein the substrate further comprises a second metallization layer in between the first metallization layer and the third metallization layer,
wherein the first metallization layer further comprises:
- a layer-1 via formed through the first substrate layer from the layer-1 trace to a lower surface of the first metallization layer, wherein the second metallization layer comprises:
- a second substrate layer;
- a layer-2 trace formed on the second substrate layer and routed within the second metallization layer; and
- a layer-2 via formed through the second substrate layer from the layer-2 trace to a lower surface of the second metallization layer, and wherein the bond finger pad is electrically coupled with the layer-3 trace through, in order, the layer-1 trace, the layer-1 via, the layer-2 trace, and the layer-2 via.

8. The IC package of claim 1, wherein a die-pad distance is less than an edge-pad distance, the die-pad distance being a distance from the wire bond die to the bond finger pad and the edge-pad distance being a distance from an edge of the substrate to the bond finger pad.

9. The IC package of claim 1, wherein the IC package comprises multiple wire bond dies above the FC die in which each of the multiple wire bond dies are electrically coupled to the FC die through corresponding wire bonds and bond finger pads.

10. The IC package of claim 1, wherein the trace is formed from copper (Cu) or aluminum (Al).

11. The IC package of claim 1, wherein the bond finger pad is a plated metal.

12. The IC package of claim 11, wherein the plated metal comprises plated nickel or gold or both.

13. The IC package of claim 1, wherein the wire bond is a reverse wire bond in which one end is ball bonded to the bond finger pad and other end is stitch bonded to the wire bond die.

14. The IC package of claim 1, wherein the FC die is a baseband modem die.

15. The IC package of claim 1, wherein the wire bond die is a memory die.

16. The IC package of claim 1, wherein the IC package is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, and a device in an automotive vehicle.

17. An integrated circuit (IC) package, comprising:
- a substrate;
- a first die disposed on the substrate;
- a wire bond die disposed above the first die;
- a wire bond connected to the wire bond die; and
- a mold on the substrate and encapsulating the first die, the wire bond die, and the wire bond; and wherein the substrate comprises one or more metallization layers including a first metallization layer, the first metallization layer comprising:
- a first substrate layer;
- a trace formed on the first substrate layer and routed within the first metallization layer to electrically couple with one or more FC interconnects of the first die; and
- a bond finger pad formed on the trace, a shape of the bond finger pad being substantially circular, wherein the wire bond electrically connects to the bond finger pad such that the wire bond die is electrically coupled with the first die through the wire bond, the bond finger pad, and the trace; and wherein a die-pad distance is less than an edge-pad distance, the die-pad distance being a distance from the wire bond die to the bond finger pad and the edge-pad distance being a distance from an edge of the substrate to the bond finger pad.

18. The IC package of claim 17, wherein the first metallization layer further comprises:
- a solder mask formed on the trace and on the first substrate layer, wherein the bond finger pad is formed within a solder mask opening (SMO) defining an area above the first substrate layer not covered by the solder mask.

19. The IC package of claim 18, wherein there is no gap between the bond finger pad and the solder mask.

20. The IC package of claim 17, wherein the trace is extended from the bond finger pad to an edge of the substrate within the first metallization layer.

21. The IC package of claim 17,
wherein the trace is a first layer-1 trace, and
wherein the first metallization layer further comprises:
- a second layer-1 trace formed on the first substrate layer and routed within the first metallization layer, the second layer-1 trace being electrically coupled with the first layer-1 trace and extended from an interior of the substrate to an edge of the substrate within the first metallization layer.

22. The IC package of claim 21,
wherein the first metallization layer further comprises:
   a first layer-1 via formed through the first substrate layer from the first layer-1 trace to a lower surface of the first metallization layer; and
   a second layer-1 via formed through the first substrate layer from the second layer-1 trace to the lower surface of the first metallization layer, and
wherein the substrate further comprises a second metallization layer below the first metallization layer, the second metallization layer comprising:
   a second substrate layer; and
   a layer-2 trace formed on the second substrate layer and routed within the second metallization layer to electrically couple with the first layer-1 via and with the second layer-1 via such that the bond finger pad is electrically coupled with the second layer-1 trace through, in order, the first layer-1 trace, the first layer-1 via, the layer-2 trace, and the second layer-1 via.

23. The IC package of claim 17,
wherein the trace is a layer-1 trace, and
wherein the substrate further comprises an additional metallization layer below the first metallization layer, the additional metallization layer comprising:
   an additional substrate layer; and
   an additional trace formed on the additional substrate layer and routed within the additional metallization layer, the additional trace being electrically coupled with the layer-1 trace and extended from an interior of the substrate to an edge of the substrate within the additional metallization layer.

24. The IC package of claim 23,
wherein the additional metallization layer is a third metallization layer, the additional substrate layer is a third substrate layer, and the additional trace is a layer-3 trace,
wherein the substrate further comprises a second metallization layer in between the first metallization layer and the third metallization layer,
wherein the first metallization layer further comprises:
   a layer-1 via formed through the first substrate layer from the layer-1 trace to a lower surface of the first metallization layer,
wherein the second metallization layer comprises:
   a second substrate layer;
   a layer-2 trace formed on the second substrate layer and routed within the second metallization layer; and
   a layer-2 via formed through the second substrate layer from the layer-2 trace to a lower surface of the second metallization layer, and
wherein the bond finger pad is electrically coupled with the layer-3 trace through, in order, the layer-1 trace, the layer-1 via, the layer-2 trace, and the layer-2 via.

25. The IC package of claim 17, wherein the IC package comprises multiple wire bond dies above the first die in which each of the multiple wire bond dies are electrically coupled to the first die through corresponding wire bonds and bond finger pads.

26. The IC package of claim 17, wherein the wire bond is a reverse wire bond in which one end is ball bonded to the bond finger pad and other end is stitch bonded to the wire bond die.

27. The IC package of claim 17, wherein the first die is a baseband modem die.

28. The IC package of claim 17, wherein the IC package is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, and a device in an automotive vehicle.

* * * * *